(12) United States Patent
Djordjevic et al.

(10) Patent No.: US 8,595,585 B2
(45) Date of Patent: Nov. 26, 2013

(54) REVERSE CONCATENATED ENCODING AND DECODING

(75) Inventors: Ivan B. Djordjevic, Tucson, AZ (US); Lei Xu, Princeton Junction, NJ (US); Ting Wang, West Windsor, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 232 days.

(21) Appl. No.: 13/116,249

(22) Filed: May 26, 2011

(65) Prior Publication Data

US 2012/0047415 A1 Feb. 23, 2012

Related U.S. Application Data

(60) Provisional application No. 61/375,313, filed on Aug. 20, 2010.

(51) Int. Cl.
*H03M 13/00* (2006.01)
*G06F 11/00* (2006.01)

(52) U.S. Cl.
USPC ............................ 714/755; 714/782; 714/801

(58) Field of Classification Search
USPC ......... 714/755, 801, 782, 795, 702, 756, 786; 375/262, 341
See application file for complete search history.

(56) References Cited

U.S. PATENT DOCUMENTS 7,502,982 B2 * 3/2009 Silvus et al. ................... 714/753
7,844,879 B2 * 11/2010 Ramamoorthy et al. ...... 714/763
7,877,662 B2 * 1/2011 Eleftheriou et al. .......... 714/756

OTHER PUBLICATIONS

Ashikhmin, A., et al. "Simple MAP Decoding of First-Order Reed-Muller and Hamming Codes", IEEE Transactions on Information Theory, vol. 50, No. 8, Aug. 2004, pp. 1812-1818.
Bahl, L.R., et al., "Optimal Decoding of Linear Codes for Minimizing Symbol Error Rate", IEEE Transactions on Information Theory, vol. IT-20, No. 2, Mar. 1974, pp. 284-287.
Batshon,H.G., et al., "Beyond 240 Gb/s per Wavelength Optical Transmission Using Coded Hybrid Subcarrier/Amplitude/Phase/Polarization Modulation", IEEE Photonics Technology Letters, vol. 22, No. 5, Mar. 2010, pp. 299-301.
Batshon, H.G., et al., "Hybrid Amplitude/Phase/Polarization Coded Modulation for 100 Gb/s Optical Transmission and Beyond" 22nd Annual Meeting of the IEEE Photonics Society, Paper ThE4, Oct. 2009, pp. 644-645.
Batshon,H.G., et al., "Multidimensional LDPC-Coded Modulation for Beyond 400 Gb/s per Wavelength Transmission", IEEE Phototonics Technology Letters, vol. 21, No. 16, Aug. 2009, pp. 1139-1141.
Chen, J., et al., "Reduced-Complexity Decoding of LDPC Codes", IEEE Transactions on Communications, vol. 53, No. 8, Aug. 2005, pp. 1288-1299.
Djordjevic, I. B., et al., "Coded Polarization-Multiplexed Iterative Polar Modulation (PM-IPM) for Beyond 400 Gb/s Serial Optical Transmission" OSA / OFC/NFOEC, Mar. 2010, 3 pages.

(Continued)

*Primary Examiner* — Phung M Chung
(74) *Attorney, Agent, or Firm* — Joseph Kolodka; James Bitetto

(57) ABSTRACT

Methods and systems for transmitting and receiving data include reverse concatenated encoding and decoding. Reverse concatenated decoding includes inner decoding the encoded stream with an inner decoder that uses a low-complexity linear-block code to produce an inner-decoder output stream, outer decoding the inner-decoder output stream with an outer decoder that uses a low-density parity-check code to produce an information stream, and iterating extrinsic bit reliabilities from the outer decoding for use in subsequent inner decoding to improve decoding performance.

15 Claims, 8 Drawing Sheets

(56) References Cited

OTHER PUBLICATIONS

Djordjevic, I.B., et al. "Coding for Optical Channels", Chapter 6, pp. 207 to 247, Springer, Mar. 2010.

Djordjevic, et al., "Proposal for Beyond 100 Gb/s Optical Transmission Based on Bit-Interleaved LDPC-coded Modulation," IEEE Photon. Technol. Lett., vol. 19, No. 12, Jun. 15, 2007, pp. 874-876.

Djordjevic, et al., "Using LDPC-coded Modulation and Coherent Detection for Ultra High-Speed Optical Transmission," IEEE/OSA J. Lightwave Technol., vol. 25, Nov. 2007, pp. 3619-3625.

Miyata, et al., "A Triple-Concatenated FEC Using Soft-Decision Decoding for 100 Gb/s Optical Transmission," in Proc. OFC/NFOEC 2010, Paper No. OThL3, Mar. 21-25, 2010, 3 pages.

Mizouchii, et al., "FPGA Based Prototyping of Next Generation Forward Error Correction," in Proc. ECOC 2009, Paper No. 5.4.1, Sep. 20-24, 2009, 4 pages.

Onohara, et al., "Soft Decision FEC for 100G Transport Systems," in Proc. OFC/NFOEC 2010, Paper No. OThL1, Mar. 21-25, 2010, 3 pages.

Saunders, et al., "Economics of 100Gb/s Transport," in Proc. OFC/NFOEC 2010, Paper No. NMB2, Mar. 21-25, 2010, 3 pages.

Savory, "Digital Filters for Coherent Optical Receivers" Optics Express, vol. 16, 2008, pp. 204-217.

\* cited by examiner

REVERSE CONCATENATED ENCODING AND DECODING

RELATED APPLICATION INFORMATION

This application claims priority to provisional application Ser. No. 61/375,313 filed on Aug. 20, 2010, incorporated herein by reference.

BACKGROUND

1. Technical Field

The present invention relates to forward error correction (FEC) for high-speed serial optical transport and, in particular, to systems and methods for reverse-concatenated encoding and decoding with low density parity-check codes.

2. Description of the Related Art

In the recent years, with the rapid growth of data-centric services and the general deployment of broadband access networks, the dense wavelength division multiplexing (DWDM) network has been upgraded from 10 Gb/s per channel to more spectrally efficient 40 Gb/s or 100 Gb/s per channel systems and beyond. 100 Gb/s Ethernet (100 GbE) has recently been standardized. As the communication rate over a fiber-optics channel increases, transmission becomes increasingly sensitive to errors due to various linear and non-linear channel impairments such as chromatic dispersion, polarization mode dispersion, and fiber nonlinearities. The Shannon limit for a noise-influenced channel describes a maximum amount of data that can be transmitted reliably with a specified bandwidth—it is therefore helpful to have robust codes and modulation schemes that closely approach the Shannon limit without imposing too high requirements in terms of implementation cost and complexity.

SUMMARY

A method for receiving data is shown that includes receiving an encoded data stream and decoding the encoded data stream with a reverse concatenated decoder, said decoding. Said decoding includes inner decoding the encoded stream with an inner decoder that uses a low-complexity linear-block code to produce an inner-decoder output stream, outer decoding the inner-decoder output stream with an outer decoder that uses a low-density parity-check code to produce an information stream, and iterating extrinsic bit reliabilities from said outer decoding for use in subsequent inner decoding to improve decoding performance.

A method for transmitting data is shown that includes receiving an information stream, encoding the information stream with a reverse concatenated encoder to enable iterated reliability reverse concatenated decoding, and transmitting the reverse concatenated encoded stream. Said encoding includes outer encoding the information stream with an outer encoder that uses a low-density parity-check (LDPC) code and inner encoding the LDPC-encoded stream with an inner encoder that uses a low-complexity block code.

A receiver is shown that includes a detector configured to receive a reverse concatenated encoded signal and pass the signal to a reverse concatenated decoder and one or more reverse concatenated decoders configured to decode the reverse concatenated encoded signal to produce an information stream. Each reverse concatenated decoder includes an inner decoder configured to decode the reverse concatenated encoded signal with a low-complexity linear-block code and to produce an inner-decoder output stream and an outer decoder configured to decode the inner-decoder output stream using a low-density parity-check code to produce an information stream and further configured to iterate extrinsic bit reliabilities to the inner decoder to improve decoding performance.

A transmitter is shown that includes one or more reverse concatenated encoders configured to encode an information stream and produce a reverse concatenated encoded stream to enable iterated reliability reverse concatenated decoding and one or more modulators configured to modulate the reverse concatenated encoded streams onto a carrier for transmission. Said reverse concatenated encoders include an outer encoder configured to encode an information stream using a low-density parity-check (LDPC) code and an inner encoder configured to encode the LDPC-encoded stream with a low-complexity linear-block code.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
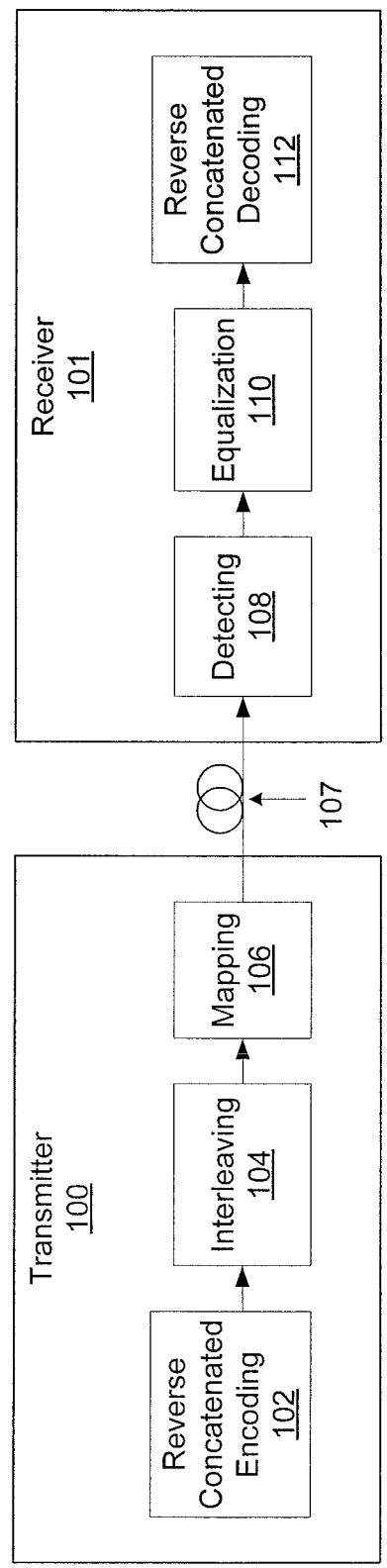
FIG. 1 shows a block diagram illustrating an optical transmission system according to the present principles.

Through the use of concatenated codes, target net coding gains can be achieved even with reasonably short low-density parity-check (LDPC) codes of low girth (e.g., girth of 6 or 8). However, short LDPC codes of low girth and reasonable LDPC decoder complexity (having, e.g., column weight 3 in a min-sum-with-correction-term decoder) exhibit error floors in the region of interest for optical communications. Using a girth 6 LDPC code as an inner code and a Reed-Soloman code as an outer code, the error floor may be eliminated, but the net coding gain is far below that of large-girth LDPC codes.

To achieve the bit error rate (BER) performance of large-girth LDPC codes using reasonably short concatenated codes, the present principles make use of an LDPC code as an outer code and, e.g., a Reed-Muller (RM) or Hocquenghem, Bose, Ray-Chaudhuri (BCH) code as an outer code. Because BCH and RM codes can be efficiently decoded using maximum a posteriori (MAP) probability, the reliable bit log-likelihood ratios (LLRs) can be forwarded to an outer LDPC decoder. Although BCH and RM codes are described herein, it is contemplated that any low-complexity block code could be used according to the present principles. With reasonably short LDPC codes, one can achieve BER performance and net coding gains comparable to large-girth LDPC codes using reverse concatenation.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to the drawings in which like numerals represent the same or similar elements and initially to FIG. 1, an optical communications system is shown comprising a transmitter 100 and a receiver 101. The transmitter encodes a plurality of data signals at the concatenated encoder block 102. A concatenated encoder may include a plurality of encoders arranged serially, as described in detail below. The encoded stream is then interleaved at interleaving block 104. The mapping and modulation block 106 then assigns bits of the interleaved signal to an iterative polarization modulation constellation, associating the bits of the interleaved data signals with the points on an iterative polar quantization (IPQ) constellation or quadrature amplitude modulation QAM constellation. The transmitter 100 then sends the signal to receiver 101 over an optical medium 107, which may include periodically deployed erbium doped fiber (EDF) amplifiers to maintain the signal strength. Other embodiments include the use of Raman and hybrid Raman/EDF amplifiers. Although embodiments described herein are directed to optical media and systems, it is contemplated that the present principles may be employed in any communications system. Receiver 101 detects symbols in the IPQ constellation at block 108. A backpropagation and equalization block 110 performs coarse digital backpropagation and turbo equalization to compensate for channel impairments such as polarization mode dispersion, chromatic dispersion, and fiber non-linearities. The signals are then de-interleaved and decoded at concatenated decoding block 112, which uses decoders of the same type as used in concatenated encoder 102 arranged in the opposite order, to produce the original data signals.

The concatenated encoders 102 and decoders 112 make use of LDPC codes to provide error correction that brings the transmissions close to the channel capacity. Several definitions will be employed below to describe LDPC decoding. A regular (n, k) LDPC code is a linear block code whose parity-check matrix H includes exactly $W_c$ 1s per column and exactly $W_r = W_c(n|(n-k))$ 1s per row, where $W_c << n-k$). The n term represents the total number of bits in a coded word produced by the LDPC code, while the k term represents the number of information bits encoded by the code word. Choice of parity matrix can greatly affect the effectiveness of the LDPC code. Decoding of LDPC codes is based on a sum-product algorithm (SPA), which is an iterative decoding algorithm that iterates extrinsic probabilities forward and back between variable- and check-nodes of bipartite (e.g., Tanner) graph representations of the parity-check matrix H. The Tanner graph of an LDPC code is drawn according to the following rule: check node c is connected to variable node v whenever element $h_{cv}$ in H is a 1. For variable-node v and check-node c the neighborhoods N(v) and N(c) are defined as the set of check-nodes and variable nodes connected to the variable nor or check node (respectively) in question.

Figure 2:
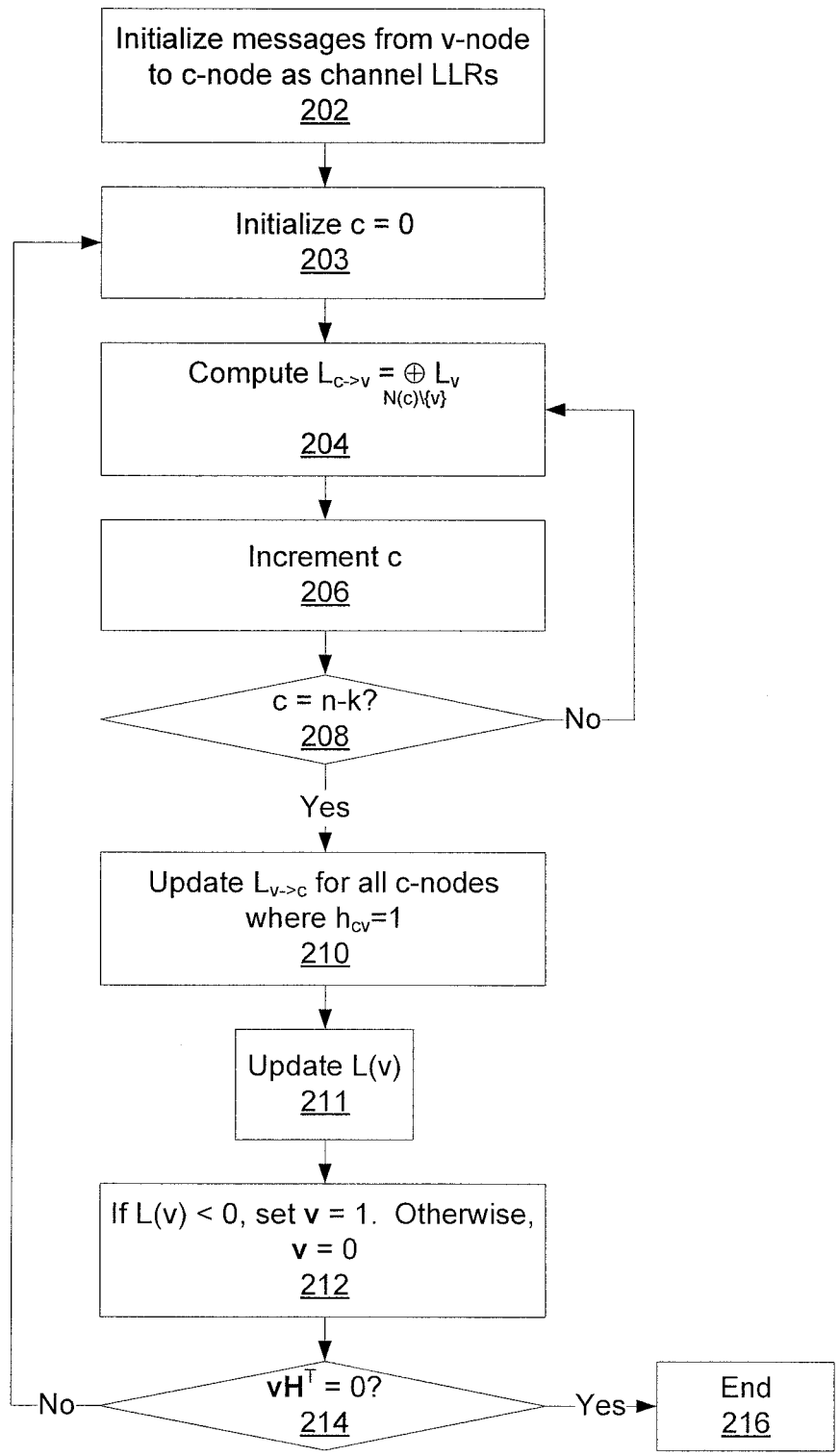
FIG. 2 shows a block/flow diagram that illustrates a Gallagher sum-product method for decoding low-density parity-check (LDPC) codes according to the present principles.

Referring now to FIG. 2, an exemplary Gallagher SPA is shown. Block 202 initializes messages $L_{v \to c}$ to be sent from variable-node v to check-node c as channel log-likelihood ratios (LLRs) $L_{ch}(v)$. Channel LLRs are defined by $$L_{ch}(v) = \log [P(v=0|y)/P(v=1|y)].$$

where y is the channel sample and the probability terms refer to the likelihood of the channel sample being a 0 or a 1 respectively. For example, for asymmetric additive white Gaussian noise (AWGN) channels, $$L_{ch}(v) = \log(\sigma_1/\sigma_2) - (y-\mu_0)^2/2\sigma_0^2 + (y-\mu_i)^2/2\sigma_1^2,$$

where the values of $\mu$ and $\sigma$ are determined by propagating a training sequence, while for a symmetric AWGN channel, $$L_{ch}(v) = 2y/\sigma^2.$$

Block 203 begins check-node updating by initializing a counter c for the check-nodes. Block 204 computes the messages $L_{c \to v}$ from the check-nodes to the variable-nodes as a new summation over the neighborhood of check-node c excluding the variable-node v:

$$L_{c \to v} = \bigoplus_{N(c)\setminus\{v\}} L_{v \to c}.$$

The $\oplus$ operator is defined for the Gallagher SPA by $$L_1 \oplus L_2 = \prod_{k=1}^{2} \text{sign}(L_k) \phi\left(\sum_{k=1}^{2} \phi(|L_k|)\right),$$

where $\phi(x) = -\log(\tan h(x/2))$. Block 206 then increments the counter c and block 208 checks whether c has reached n-k. If not, processing returns to block 204 to handle the next check-node. If so, processing goes on to update the variable-nodes using a v-node update rule.

Block 210 calculates a new $L_{v \to c}$ for each variable-node v as $$L_{v \to c} = L_{ch}(v) + \sum_{N(v)\setminus\{c\}} L_{c \to v}$$

for every c node where $h_{cv}=1$. Block 211 updates the log-likelihood ratio for variable-node v (corresponding to the likelihood of a given bit being one or zero) for all v as:

$$L(v) = L_{ch}(v) + \sum_{N(v)} L_{c \to v}.$$

If $L(v)<0$, a decision $\hat{v}$ corresponding to the transmitted bit value of v is set to 1, otherwise $\hat{v}=0$. Decision block 214 determines whether $\hat{v}H^T=0$. If so, processing ends at block 216. Otherwise processing returns to check-node updating at block 203.

The Gallagher SPA's check-node update rule involves both a logarithm and a hyperbolic tangent, making it computationally intensive. As such, approximations are used to reduce the processing burden. One such approximation is the min-sum-plus-correction-term approximation. It can be shown that the $\oplus$ operator can also be calculated as:

$$L_1 \oplus L_2 = \alpha \left[ \prod_{k=1}^{2} \text{sign}(L_k) \min(|L_1|, |L_2|) + c(x, y) \right].$$

The c(x,y) term denotes a correction factor defined by:

$$c(x,y) = \log[1+\exp(-|x+y|)] - \log[1+\exp((-|x-y-|)],$$

which may be implemented as a lookup table (LUT). The $\alpha$ term represents an attenuation factor. In tests, it has been found that the min-sum-plus-correction-term decoding suffers negligible performance loss as compared to Gallagher SPA. Min-sum decoding with an optimal attenuation factor of $\alpha=0.8$ (for Gaussian channels) performs the same as Gallagher SPA.

Figure 3:
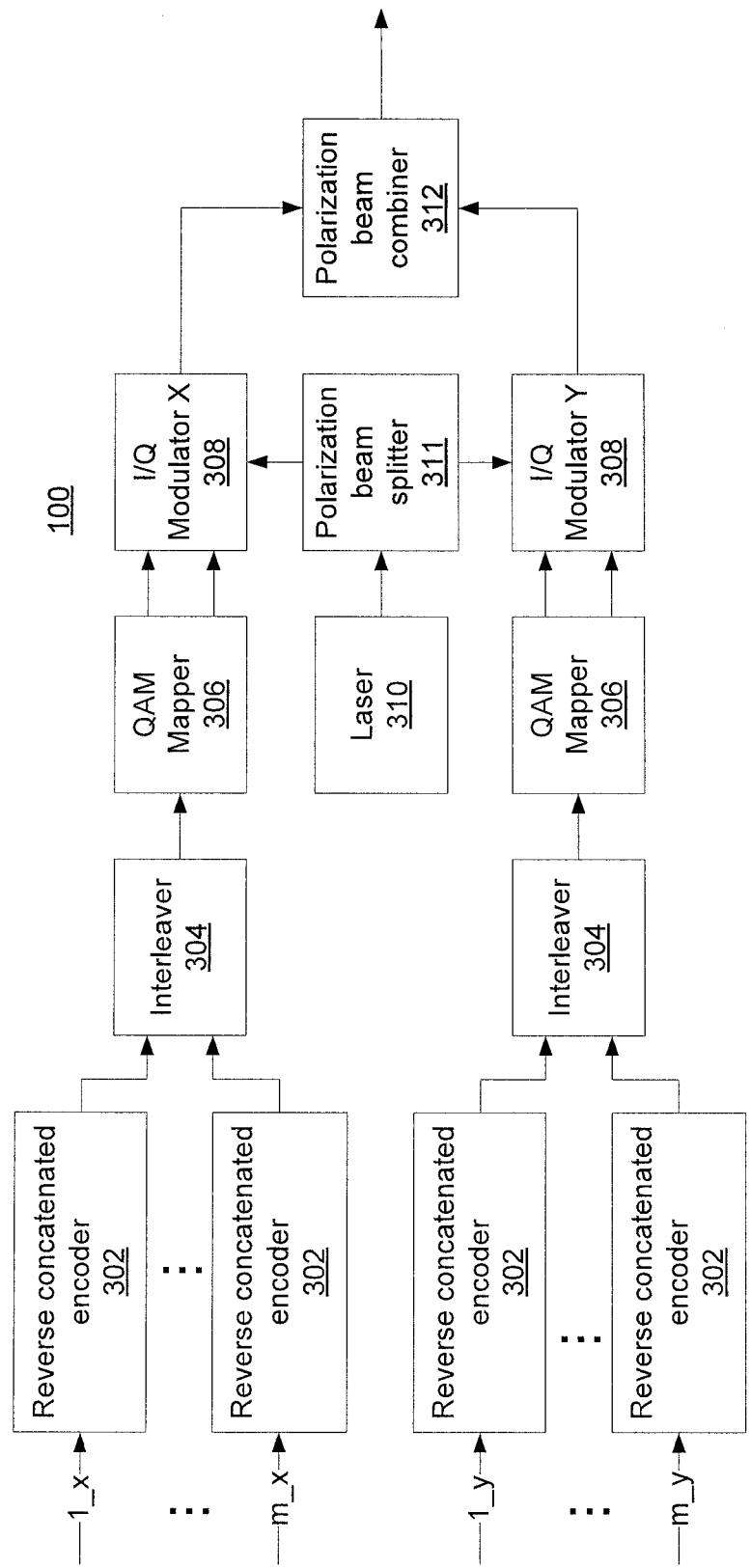
FIG. 3 shows a block diagram illustrating an optical transmitter that employs reverse concatenated codes according to the present principles.

Referring now to FIG. 3, a detailed view of transmitter 100 is shown. 2m data signals feed into the transmitter. The data signals are divided into m signals to be put on an x polarization and m signals for a y polarization. FIG. 3 illustrates two separate branches, one for each of the respective polarization, and m signals for each branch. Although the branches are described herein as having equal numbers of input data signals, the branches may also accept different numbers of inputs. The data streams are encoded at reverse concatenated encoders 302 using different reverse concatenated codes having code rates $R_i=K_i/H(i\in\{x,y\})$, where $K_i$ denotes the number of information symbols used in the binary reverse concatenated code corresponding to each polarization and N denotes the codeword length.

The outputs of the encoders are then bit-interleaved by m×N bit-interleavers 304, where the sequences are written row-wise and read column-wise from a block-interleaver. The output of the interleavers 304 is sent in respective bit-streams m bits at a time instant i, to mappers 306.

The mappers 306 map each m bits into a $2^m$-ary QAM signal constellation or IPQ constellation point based on a lookup table. The mappers 306 assign bits to constellation points in polar coordinates $s_i=(I_i,Q_i)=|s_i|\exp(j\phi_i)$, where I and Q represent the in-phase and quadrature channels respectively, and with the mapped coordinates from the mapper 306 being used as the inputs of an I/Q modulators 308. A laser 310 produces a carrier beam that is split at polarization beam splitter 311 into two orthogonal polarizations. The I/Q modulators 308 modulate the constellation points onto the orthogonally polarized carrier beams. The beams from the respective branches of the transmitter 100 are then combined in beam combiner 312 before being transmitted on an optical fiber. Because the combined beams occupy polarizations that are orthogonal with respect to one another, they can be combined without loss of information.

Figure 4:
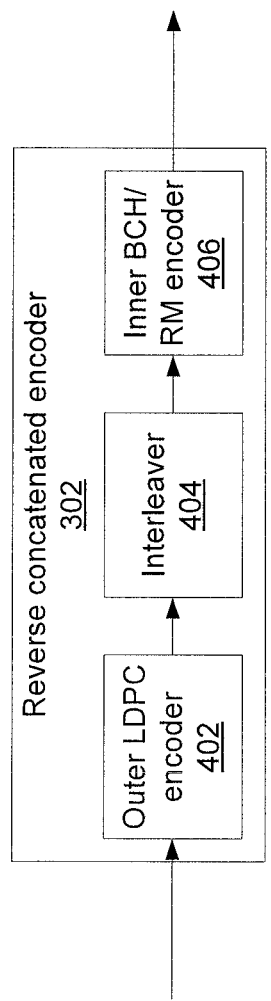
FIG. 4 shows a block diagram illustrating a reverse concatenated encoder according to the present principles.

Referring now to FIG. 4, a detailed view of the reverse concatenated encoder 302 is shown. The information stream is received by outer LDPC encoder 402 which uses, for example, an LDPC code having girth 8 and column weight 3. This encoded information passes to an interleaver 404 before being encoded again by an inner encoder 406 that uses, for example, a BCH or RM code.

Figure 5:
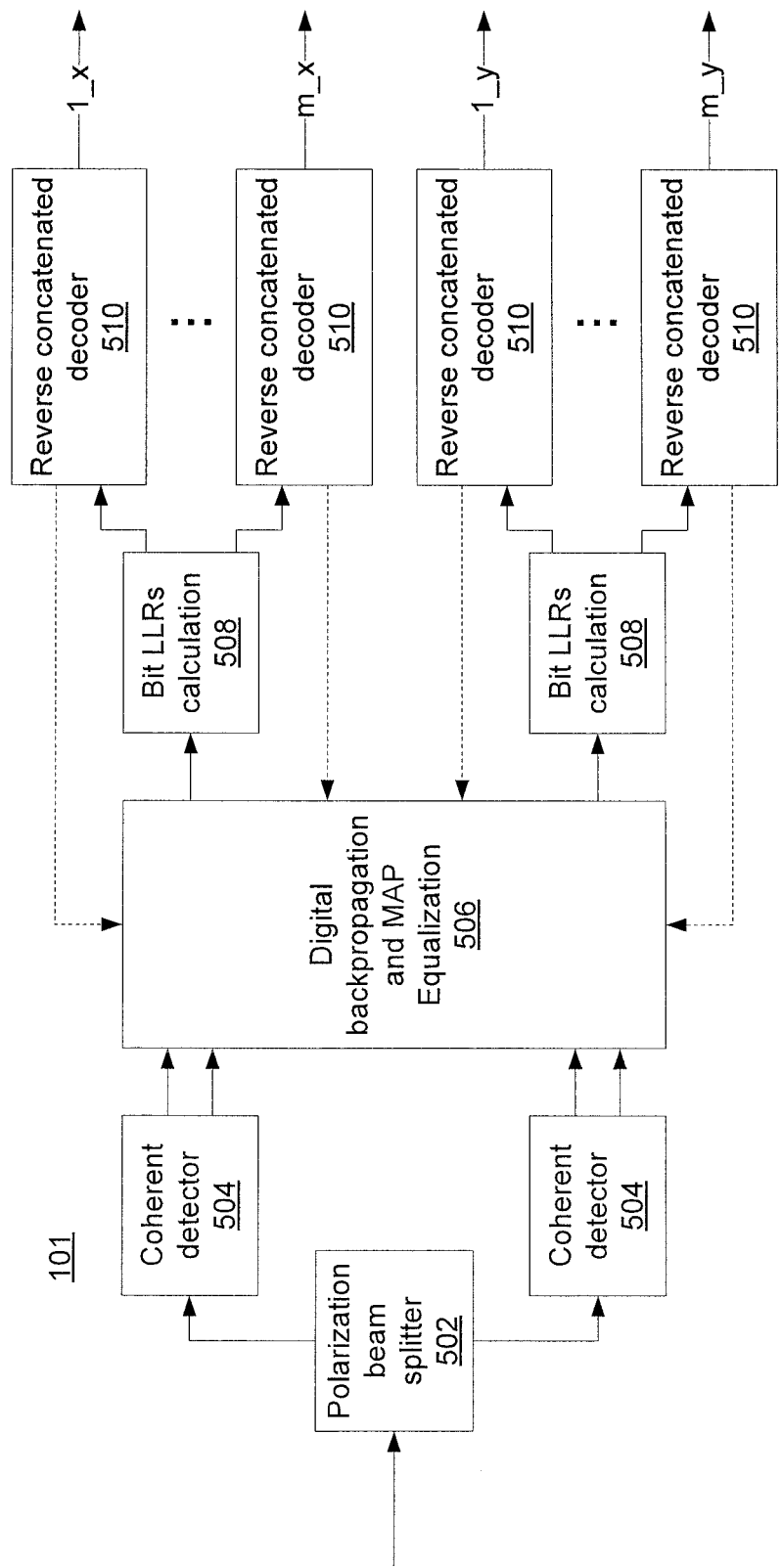
FIG. 5 shows a block diagram illustrating an optical receiver that decodes reverse concatenated codes according to the present principles.

Referring now to FIG. 5, a detailed view of the receiver 101 is shown. A carrier beam is received from an optical fiber and is split at polarization beam splitter 502 into two orthogonal polarizations. Detectors 504 demodulate the beams to produce I and a Q signal estimates by sampling their respective signals. Although detectors 504 are advantageously implemented as coherent detectors, it is contemplated that other sorts of detector might be used. In embodiments that employ coherent detection, a local laser source (not shown) is used to provide the detectors 504 with a local reference that allows them to quickly distinguish between the orthogonal polarizations and extract the information.

The I and Q signals produced by the detectors 504 then pass to module 506 which performs digital backpropagation and MAP equalization, where various channel impairments are corrected. The data stream is then passed to bit log likelihood ratio (LLR) modules 508. The bit LLR modules 508 determine the bit LLRs from symbol LLRs. The bit LLR modules 508 include a lookup table that stores the same constellation information as the lookup table at the transmitter, allowing the bit LLR modules 508 to convert symbols to bit sequences. The symbol LLRs are defined as $\lambda(s)=\log[P(s|r)/P(s_0|r)]$, where $s=(I,Q_i)$ and $r=(r_I,r_Q)$ denote the transmitted signal constellation point and received symbol at time instance i respectively, and $s_0$ represents the reference symbol, and are determined in block 506. Each symbol s is represented by a binary representation $c=(c_1, c_2, \ldots, c_J)$, where each bit $c_i$ of the observed symbol s is shown. Bit LLRs are defined using the bit LLRs as:

$$L(c_i) = \log \frac{\sum_{c:c_i=0} \exp(\lambda(q))\exp\left(\sum_{c:c_{ji}=0, j\neq i} L_a(c_j)\right)}{\sum_{c:c_i=1} \exp(\lambda(q))\exp\left(\sum_{c:c_{ji}=0, j\neq i} L_a(c_j)\right)},$$

where $L_a(c_j)$ is the a priori information determined from the reverse concatenated decoder's extrinsic LLRs. $L(c_i)$ calculates the logarithm of the ratio of a probability that each bit $c_i$ is zero, and a probability that each bit is one. In the nominator, the summation is done over all symbols q having a zero at position I, while in the denominator summation is performed over all symbols q having a one at position i. By iterating extrinsic reliabilities between MAP detector 506 and reverse concatenated decoder 510, overall performance is improved.

The bit LLR modules 508 each produce m bit LLRs which are processed by m reverse concatenated decoders 510. Bit reliabilities for the reverse concatenated decoders 510 are calculated from symbol reliabilities. To improve bit error rate (BER) performance, EXIT chart analysis is used in selecting of LDPC codes and extrinsic reliabilities are iterated between maximum a posteriori (MAP) equalizer 506 and reverse concatenated decoders 510 in turbo equalization fashion until convergence or until a predetermined number of iterations has been reached. The MAP equalizers form a part of the turbo equalizer in block 506. One advantageous embodiment of a MAP equalizer uses the Bahl-Cocke-Jelinek-Raviv (BCJR) method. Another uses a soft-output viterbi method (SOVA) for equalization. It is contemplated that any suitable implementation of a MAP equalizer may be employed. The reverse concatenated decoders 510 then produce the original 2m data signals as output and feed back extrinsic LLR information to the turbo equalizers in block 506. The equalizers can compensate for nonlinear polarization mode dispersion as well.

Figure 6:
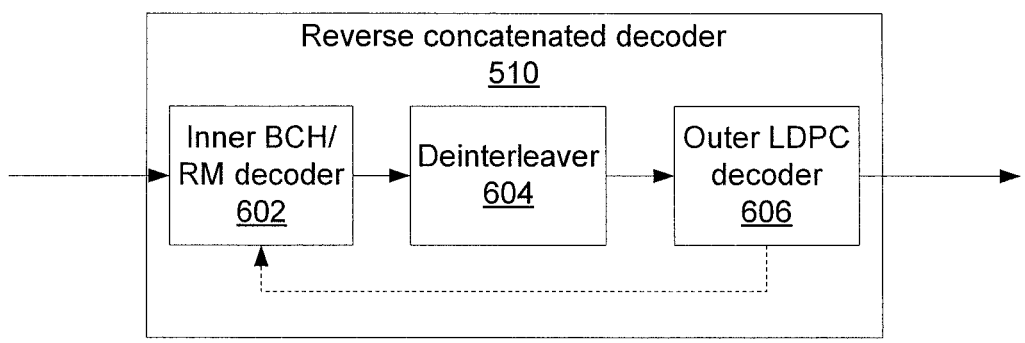
FIG. 6 shows a block diagram illustrating a reverse concatenated decoder according to the present principles.

Referring now to FIG. 6, a detailed view of reverse concatenated decoders 510 is shown. Encoded data is received by the inner decoder 602 which employs, for example, a BCH or RM decoder. If BCH is used, the inner decoder 602 may be implemented as a soft MAP decoder, and if RM is used, the inner decoder 602 may be implemented based on Ashikmin-Lytsin soft-decision decoding. The output of the inner decoder 602 is deinterleaved by deinterleaver 604 and then LDPC decoded by the outer LDPC decoder 606. To improve performance of the reverse concatenated decoder 510, extrinsic LLRs are iterated between the inner BCH/RM decoder 602 and outer LDPC decoder 606. For example, the extrinsic LLR of the $j^{th}$ bit for a BCH decoder 602 in the $k^{th}$ iteration is determined by:

$$L_{BCH,e}(c_j^{(k)})=L_{LDPC}(c_j^{(k)})-L_{LDPC}(c_j^{(k-1)}),$$

where $L_{LDPC}(c_j)$ is an LLR corresponding to bit $c_j$ after LDPC decoding, while the indices k and k−1 denote a current and a previous iteration respectively.

Figure 7:
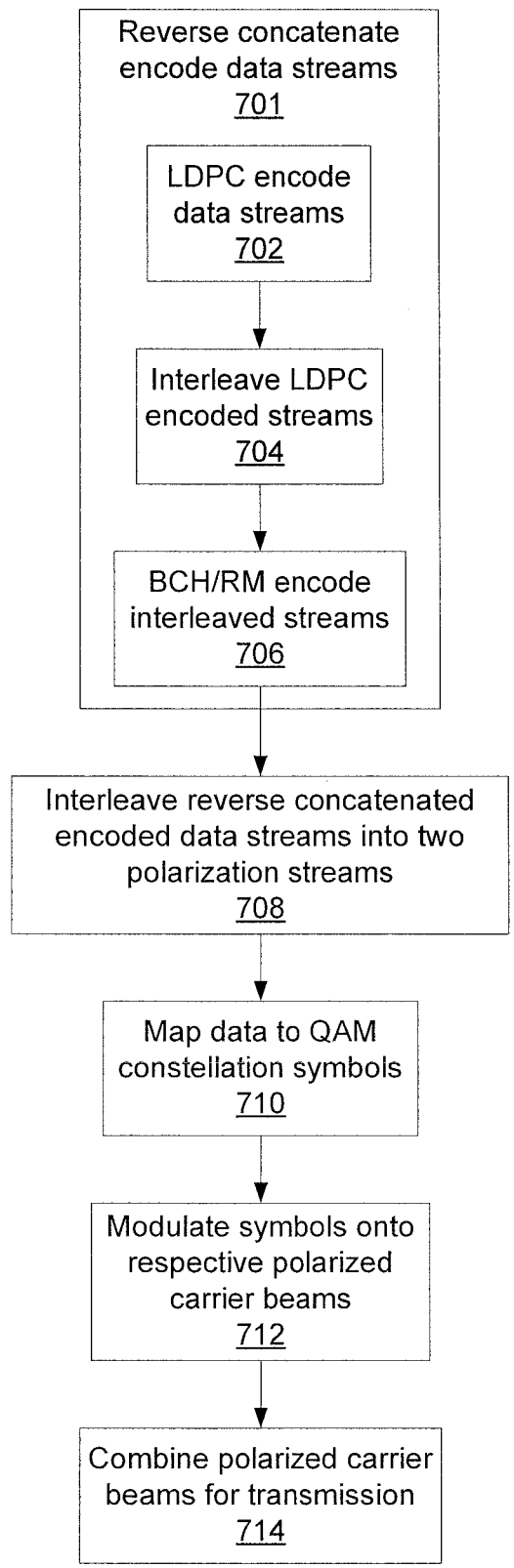
FIG. 7 shows a block/flow diagram illustrating a system/method for transmitting data using reverse concatenated codes according to the present principles.

Referring now to FIG. 7, a system/method for encoding and modulating data for transmission using reverse concatenated codes with QAM modulation is shown. These methods provide for very high transmission rates, in excess of 1 Tb/s. A plurality of data streams are encoded at block 701 using a reverse concatenated encoder as described above in reference to FIG. 6. This includes a step of LDPC encoding 702 the data stream using an inner LDPC encoder. Block 704 then interleaves the LDPC encoded data stream before block 706 encodes the interleaved streams with, e.g., a BCH or RM encoder.

Block 708 takes the reverse concatenated encoded streams and interleaves them, preparing the streams for transmission onto two polarization streams. The data streams intended for transmission over corresponding polarization streams are mapped by block 710 to QAM constellation symbols, providing I and Q values that identify particular symbols. The I and Q values for each set of symbols are used to modulate the symbols onto orthogonally polarized carrier beams via quadrature amplitude modulation by block 712 onto respective polarized orthogonal carrier beams. The polarized carrier beams may then be combined into a single beam by block 714, such that the two polarizations do not interfere with one another during transmission. The combined carrier beam can then be transmitted over an optical fiber to its destination.

Figure 8:
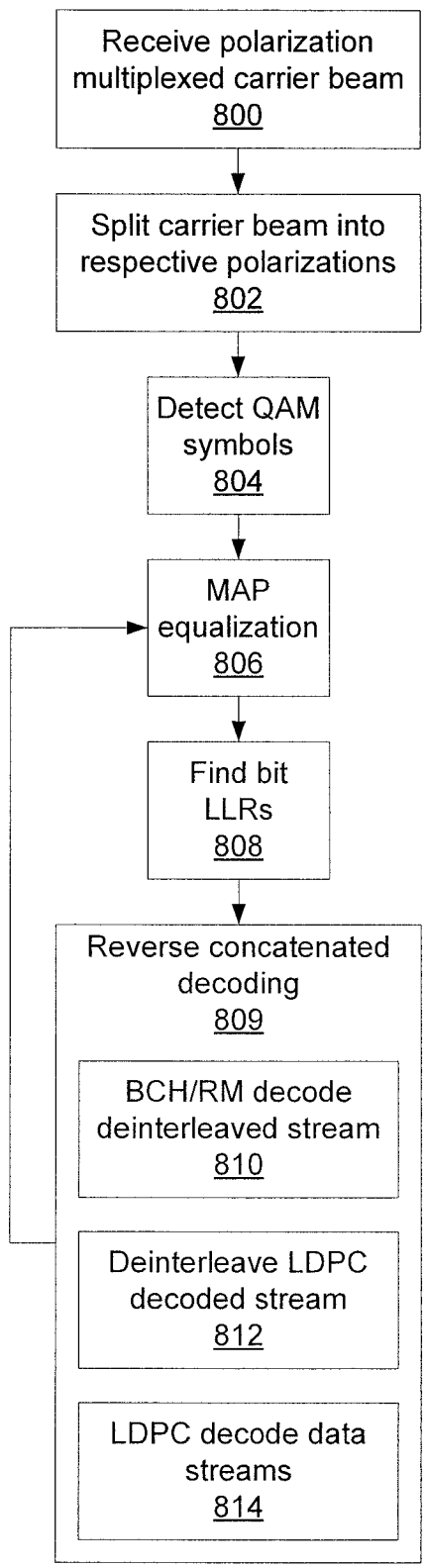
FIG. 8 shows a block/flow diagram illustrating a system/method for receiving and decoding data using reverse concatenated codes according to the present principles.

Referring now to FIG. 8, a system/method for receiving and decoding received data is shown. A combined carrier beam is received from an optical transmission fiber at block 800 and is then split into two orthogonal polarizations at block 802. QAM symbols are then detected and extracted from the carrier beams at block 804. It is contemplated that any method of detection could be used, but for the purposes of example and discussion coherent detection is used herein.

Channel distortions are compensated for using turbo equalization in block 806. The bit LLRs used for reverse concatenated decoding are calculated at block 808 from symbol LLRs. Block 809 then performs reverse concatenated decoding. Block 810 employs, for example, an inner BCH or RM decoder to perform MAP decoding. This data is then deinterleaved at block 812 before being LDPC decoded by an outer LDPC decoder at block 814. The bit LLRs from block 808 are used to LDPC decode the encoded data according to, for example, min-sum-with-correction-term as discussed above. Extrinsic LLR information is passed back to block 806 from the LDPC decoding 814 to be used in subsequent turbo equalization iterations.

Reverse concatenated codes according to the present principles show substantial performance gains. For example, a reverse concatenated code using a (16935,14819) LDPC code and a (128,120) BCH code outperforms the corresponding turbo-product counterpart with a Chase II decoding algorithm by 0.88 dB at a BER of $10^{-9}$. The net coding gain of the same reverse concatenated code is 9.56 dB at the same BAR, while the net coding gain at a BER of $10^{-13}$ is 11.32 dB. Furthermore, the exemplary reverse concatenated code is only 0.2 dB away from a girl 12 LDPC code of length 345165.

Having described preferred embodiments of a system and method for reduced-complexity LDPC decoding (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for receiving data, comprising:
receiving an encoded data stream; and
decoding the encoded data stream with a reverse concatenated decoder, said decoding comprising:
inner decoding the encoded stream with a soft maximum a posteriori inner decoder that uses a low-complexity linear-block code to produce an inner-decoder output stream;
outer decoding the inner-decoder output stream with an outer decoder that uses a low-density parity-check code having a girth between 6 and 8 and a column weight of 3 to produce an information stream; and
iterating extrinsic log-likelihood ratios from said outer decoding for use in subsequent inner decoding to improve decoding performance.

2. The method of claim 1, wherein the inner decoder uses a Bose-Chaudhuri-Hocquenghem (BCH) code.

3. The method of claim 1, wherein the inner decoder uses a Reed-Muller code.

4. The method of claim 1, wherein decoding further comprises deinterleaving the inner-decoder output stream before outer decoding.

5. A method for transmitting data, comprising:
receiving an information stream;
encoding the information stream with a reverse concatenated encoder to enable iterated reliability reverse concatenated decoding, said encoding comprising:

outer encoding the information stream with an outer encoder that uses a low-density parity-check (LDPC) code having a girth between 6 and 8 and a column weight of 3; and inner encoding the LDPC-encoded stream with an inner encoder that uses a low-complexity block code; and transmitting the reverse concatenated encoded stream.

6. The method of claim 5, wherein the inner encoder uses a Bose-Chaudhuri-Hocquenghem (BCH) code.

7. The method of claim 5, wherein the inner encoder uses a Reed-Muller code.

8. The method of claim 5, wherein the encoding further comprises interleaving the LDPC-encoded stream before inner encoding.

9. A receiver, comprising:
   a detector configured to receive a reverse concatenated encoded signal and pass the signal to a reverse concatenated decoder; and
   one or more reverse concatenated decoders configured to decode the reverse concatenated encoded signal to produce an information stream, each comprising:
      a soft maximum a posteriori inner decoder configured to decode the reverse concatenated encoded signal with a low-complexity linear-block code and to produce an inner-decoder output stream; and
      an outer decoder configured to decode the inner-decoder output stream using a low-density parity-check code having a girth between 6 and 8 and a column weight of 3 to produce an information stream and further configured to iterate extrinsic log-likelihood ratios to the inner decoder to improve decoding performance.

10. The receiver of claim 9, wherein the inner decoder uses a Bose-Chaudhuri-Hocquenghem (BCH) code.

11. The receiver of claim 9, wherein the inner decoder uses a Reed-Muller code.

12. A transmitter, comprising:
   one or more reverse concatenated encoders configured to encode an information stream and produce a reverse concatenated encoded stream to enable iterated reliability reverse concatenated decoding, each comprising:
      an outer encoder configured to encode an information stream using a low-density parity-check (LDPC) code having a girth between 6 and 8 and a column weight of 3; and
      an inner encoder configured to encode the LDPC-encoded stream with a low-complexity linear-block code; and
   one or more modulators configured to modulate the reverse concatenated encoded streams onto a carrier for transmission.

13. The transmitter of claim 12, wherein the inner encoder uses a Bose-Chaudhuri-Hocquenghem (BCH) code.

14. The transmitter of claim 12, wherein the inner encoder uses a Reed-Muller code.

15. The transmitter of claim 12, wherein the one or more reverse concatenated encoders each further comprise an interleaver configured to interleave the LDPC-encoded stream and to output the interleaved stream to the inner encoder.

* * * * *